(12) United States Patent
Lee et al.

(10) Patent No.: US 12,349,322 B2
(45) Date of Patent: Jul. 1, 2025

(54) HEAT DISSIPATION MODULE AND POWER CONVERSION DEVICE COMPRISING SAME

(71) Applicant: LG INNOTEK CO., LTD., Seoul (KR)

(72) Inventors: Mi Sun Lee, Seoul (KR); Sang Hun An, Seoul (KR); Ji Hwan Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 232 days.

(21) Appl. No.: 18/019,766

(22) PCT Filed: Aug. 5, 2021

(86) PCT No.: PCT/KR2021/010356
§ 371 (c)(1),
(2) Date: Feb. 3, 2023

(87) PCT Pub. No.: WO2022/031084
PCT Pub. Date: Feb. 10, 2022

(65) Prior Publication Data
US 2023/0292472 A1    Sep. 14, 2023

(30) Foreign Application Priority Data

Aug. 5, 2020    (KR) .................. 10-2020-0097954

(51) Int. Cl.
*H05K 7/20*    (2006.01)
(52) U.S. Cl.
CPC ......... *H05K 7/209* (2013.01); *H05K 7/20445* (2013.01); *H05K 7/205* (2013.01)

(58) Field of Classification Search
CPC . H01L 23/427; H01L 23/3672; H01L 23/367; H01L 21/4882; F28D 2021/0029;
(Continued)

(56) References Cited

U.S. PATENT DOCUMENTS 4,724,901 A * 2/1988 Munekawa ......... F28D 15/0266
257/722
6,483,708 B2    11/2002 Ali et al.
(Continued)

FOREIGN PATENT DOCUMENTS

KR      20-0317709 Y1     6/2003
KR     10-2012-0121676 A    11/2012
(Continued)

*Primary Examiner* — Mandeep S Buttar
(74) *Attorney, Agent, or Firm* — Birch, Stewart, Kolasch & Birch, LLP (57) ABSTRACT

A heat dissipation module comprises: a heating element; a heat dissipation member disposed on one side of the heating element and including a first plate and a second plate; a third plate disposed on one side of the heating element; and a heat transfer path for transferring the heat generated from the heating element to the heat dissipation member. The heat transfer path comprises: a first path disposed between the first plate and the second plate; a third path disposed within the third plate; and a plurality of unit heat transfer paths having a second path connecting the first path and the third path, wherein the respective second paths of the plurality of unit heat transfer paths are spaced apart from each other.

18 Claims, 6 Drawing Sheets

(58) Field of Classification Search
CPC ........ F28D 15/02; F28D 1/0475; F28D 15/04; F28D 2021/0028; G06F 1/20; G06F 2200/201; H05K 7/20336; H05K 7/20509; H05K 7/20254; H05K 1/0203; H05K 7/209; H05K 7/20418; H05K 7/20445; H05K 7/20436; F28F 2215/12; F28F 2255/02; F28F 1/02
USPC ......................................................... 361/714
See application file for complete search history.

(56) References Cited

U.S. PATENT DOCUMENTS

| | | | | |
|---|---|---|---|---|
| 10,306,805 | B2* | 5/2019 | Yu | ............... H05K 7/20809 |
| 11,758,688 | B2* | 9/2023 | Li | ..................... G06F 1/20 |
| | | | | 165/80.4 |
| 2002/0030972 | A1 | 3/2002 | Ali et al. | |
| 2007/0051501 | A1* | 3/2007 | Wu | ..................... H01L 23/427 |
| | | | | 257/E23.084 |
| 2009/0236076 | A1* | 9/2009 | Min | ..................... F28D 15/0275 |
| | | | | 165/151 |
| 2011/0005727 | A1* | 1/2011 | Yu | ..................... F28D 15/0275 |
| | | | | 29/890.032 |
| 2016/0079150 | A1 | 3/2016 | Chawla et al. | |
| 2020/0083143 | A1* | 3/2020 | Tsai | ..................... H01L 24/16 |
| 2020/0146190 | A1 | 5/2020 | Seo et al. | |
| 2020/0217599 | A1* | 7/2020 | Narasimhan | ............ F28D 15/02 |
| 2020/0365984 | A1* | 11/2020 | Chen | ..................... H01Q 1/1207 |
| 2021/0068244 | A1* | 3/2021 | Jung | ..................... H05K 9/009 |

FOREIGN PATENT DOCUMENTS

| | | |
|---|---|---|
| KR | 10-2016-0031408 A | 3/2016 |
| KR | 10-2020-0028319 A | 3/2020 |
| KR | 10-2020-0050261 A | 5/2020 |

* cited by examiner

HEAT DISSIPATION MODULE AND POWER CONVERSION DEVICE COMPRISING SAME

CROSS REFERENCE TO RELATED APPLICATIONS

This application is the National Phase of PCT International Application No. PCT/KR2021/010356, filed on Aug. 5, 2021, which claims priority under 35 U.S.C. 119 (a) to Patent Application No. 10-2020-0097954, filed in the Republic of Korea on Aug. 5, 2020, all of which are hereby expressly incorporated by reference into the present application.

TECHNICAL FIELD

The present embodiment relates to a heat dissipation module and a power conversion device comprising same.

BACKGROUND ART

Recently, countries around the world are making various attempts to replace existing fossil energy resources. First of all, for the use of nature-friendly energy, intensive investment in the renewable energy industry for the use of nature-friendly energy and the energy distribution and storage industry for energy efficiency improvement has been going on, and in Korea, various policies for the energy industry are being planned and underway due to the shutdown of nuclear power plants and power outages following the earthquake in Japan, and looking at this trend of the times, demand for new and renewable energy is increasing, and in line with this, technologies for efficiently managing power, such as smart grids, are also being actively researched.

The problem of using energy efficiently leads to an analysis of demand patterns such as the place and time of users who use energy, and the core concept of smart grid is how to distribute the produced energy in consideration of the user's demand patterns.

Therefore, in order to store the produced energy in a certain time or space and supply it according to the usage pattern of the consumer, a storage device in which the produced energy can be stored, that is, a battery, is required, and the concept of expanding these batteries is called an energy storage system (ESS).

An energy storage system (ESS) is an energy storage system that controls various voltages and currents generated from distributed power or renewable energy to connect to a power system as needed or to store and use idle energy. The power conversion system (PCS) is a system that converts characteristics of electricity, that is, AC/DC, voltage, frequency, and the like to receive power from a power source inside the energy storage system (ESS) and store it in a battery or discharge it to the grid.

As an example of a power conversion device, a DC-DC converter refers to an electronic circuit device that converts DC power of a certain voltage to DC power of another voltage, and it is used in various fields such as television receivers, automotive electronic parts, and energy storage systems (ESS).

The outer shape of the power conversion device is formed by the housing, and a number of electronic components for driving are disposed inside the housing. The plurality of electronic components generates heat by being driven.

Accordingly, a heat dissipation member for absorbing heat generated from the electronic component may be disposed in the housing for heat dissipation. The heat dissipation member may be in contact with the electronic component and transfer heat generated by the electronic component to another region (for an example, a housing).

However, considering the narrow space inside the housing, there is a structural difficulty in arranging the electronic components and the heat dissipation member in a single housing. In addition, there is a problem in that the heat of the electronic components is blocked by the printed circuit board due to the arrangement structure of the electronic components and the printed circuit board, so that heat dissipation through convection does not proceed properly, so that the heat stays inside the housing.

DETAILED DESCRIPTION OF THE INVENTION

Technical Subject

The present embodiment is to provide a heat dissipation module capable of improving heat dissipation efficiency by improving the structure and a power conversion device including the same.

Technical Solution

A heat dissipation module according to the present embodiment comprises: a heating element; a heat dissipation member being disposed on one side of the heating element and including a first plate and a second plate; a third plate being disposed on one side of the heating element; and a heat transfer path for transferring the heat generated from the heating element to the heat dissipation member, wherein the heat transfer path comprises a first path being disposed between the first plate and the second plate, a third path being disposed inside the third plate, and a plurality of unit heat transfer paths having a second path connecting the first path and the third path, and wherein the respective second paths of the plurality of unit heat transfer paths are spaced apart from one another.

A heat dissipation module according to another embodiment comprises: a heating element; a heat dissipation member being disposed on one side of the heat generating element and including a first plate and a second plate; and a heat transfer path that transfers heat generated from the heating element to the heat dissipating member, wherein the heat transfer path includes a first path being disposed between the first plate and the second plate, and second path being connected to the first path and disposed between the heating element and the heat dissipation member, and wherein the first plate includes a first hole having a long axis greater than or equal to the length of the long axis of the first path.

A heat dissipation module according to yet another embodiment comprises: a heating element; a heat dissipation member being disposed on one side of the heat generating element and including a first plate and a second plate; and a heat transfer path for transferring heat generated from the heating element to the heat dissipating member, wherein the heat transfer path includes a plurality of unit heat transfer paths having one side to which the heat of the heating element is transferred, other side being disposed between the first plate and the second plate, and a connecting path connecting the one side and the other side, wherein the connecting paths of the plurality of unit heat transfer paths are spaced apart from each other, and wherein the first plate includes a plurality of first holes through which the other side of the plurality of unit connecting paths passes.

A heat dissipation module according to still another embodiment comprises: a heating element; a heat dissipation member being disposed on one side of the heat generating element; a heat transfer path being disposed between the heat dissipation member and the heating element; and a substrate being disposed between the heat dissipating member and the heating element, wherein the heat transfer path has one side being disposed adjacent to the heating element and the other side being disposed inside the heat dissipation member through the substrate, and wherein the substrate is spaced apart from the heating element and the heat dissipation member.

The heat dissipation member may include a plurality of fins being disposed between the first plate and the second plate, and the fins may be formed of an elastic member.

The heat dissipation member may include a heat transfer pad being disposed on a lower surface of the second plate, wherein the heat transfer pad may contact the first path.

A substrate being disposed between the heat dissipation member and the heating element may be included, and the substrate may include a second hole through which the heat transfer path penetrates.

An inner circumferential surface of the second hole may be spaced apart from the heat transfer path.

The cross-sectional area of the first hole may be larger than the cross-sectional area of the second hole.

The first hole may be overlapped with the second hole in an up-and-down direction.

Advantageous Effects

Through the present embodiment, there is an advantage in that the heat of a heating element can be efficiently dissipated by forming a heat dissipation path through a heat dissipation member and a heat transfer path. In particular, since it is possible to form a heat dissipation structure while sufficiently securing an arrangement region for other components including a printed circuit board, there is an advantage in that a wider space inside the housing can be secured.

In addition, by elastically supporting the heating element on an inner surface of the housing through the elastic force of the heat dissipation member, the heating element can be firmly fixed to the installation region, and there is an advantage in that the heat dissipation efficiency is improved due to the increased contact force.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components. And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
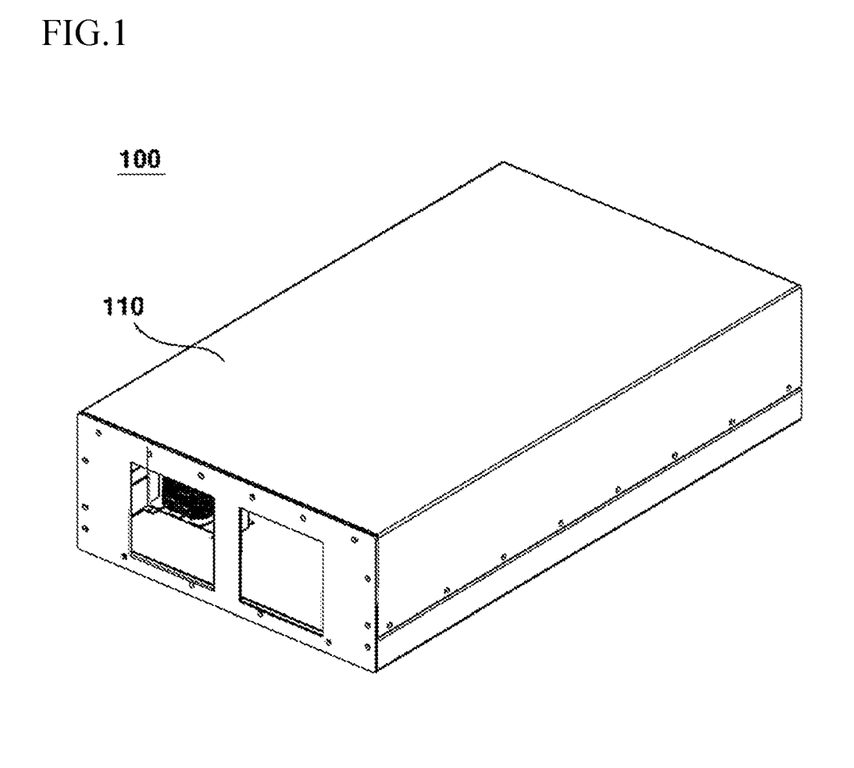
FIG. 1 is a perspective view of a power conversion device according to an embodiment of the present invention.
Figure 2:
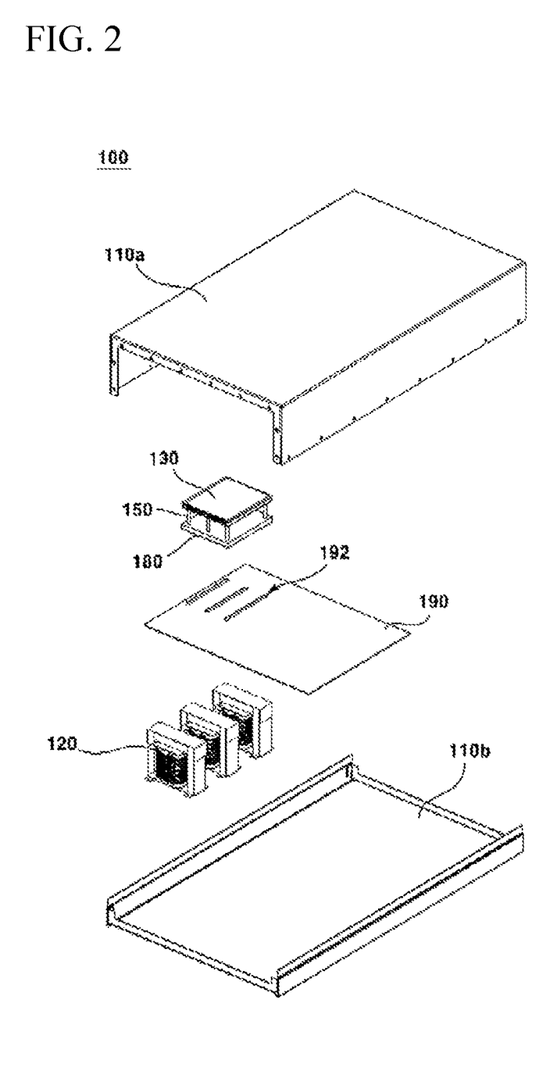
FIG. 2 is an exploded perspective view of a power conversion device according to an embodiment of the present invention.
Figure 3:
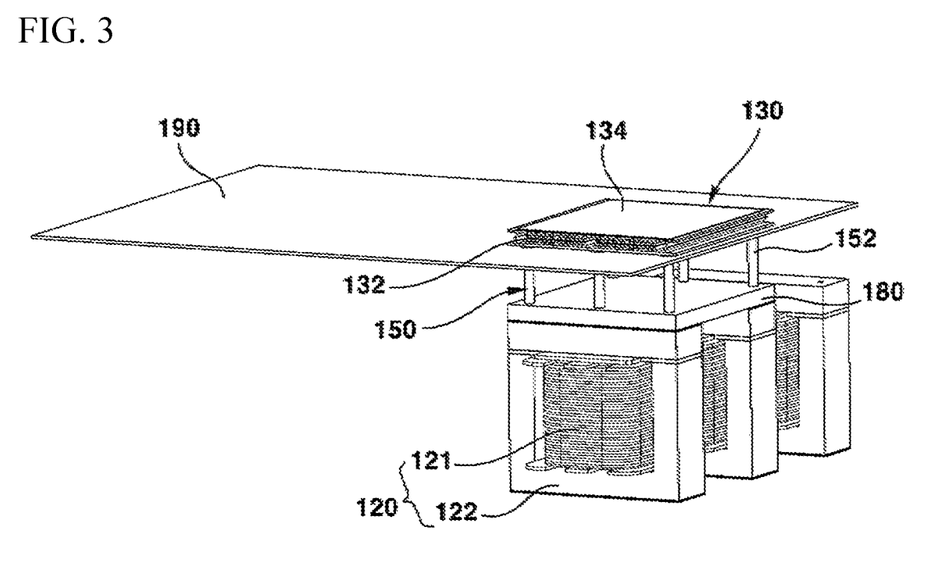
FIG. 3 is a perspective view of a heat dissipation module according to an embodiment of the present invention.
Figure 4:
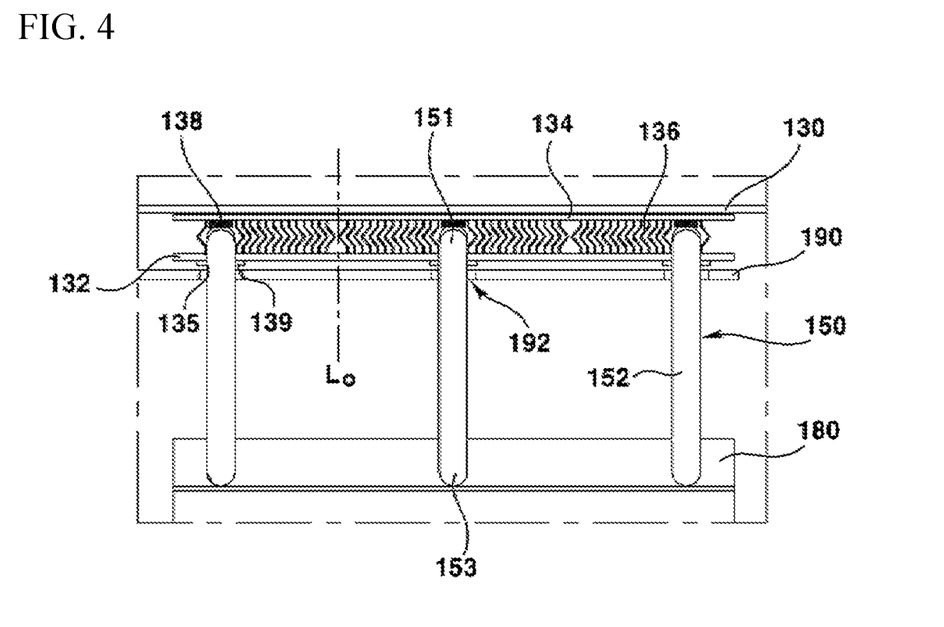
FIG. 4 is a cross-sectional view illustrating a coupling structure of a heat dissipation module according to an embodiment of the present invention.
Figure 5:
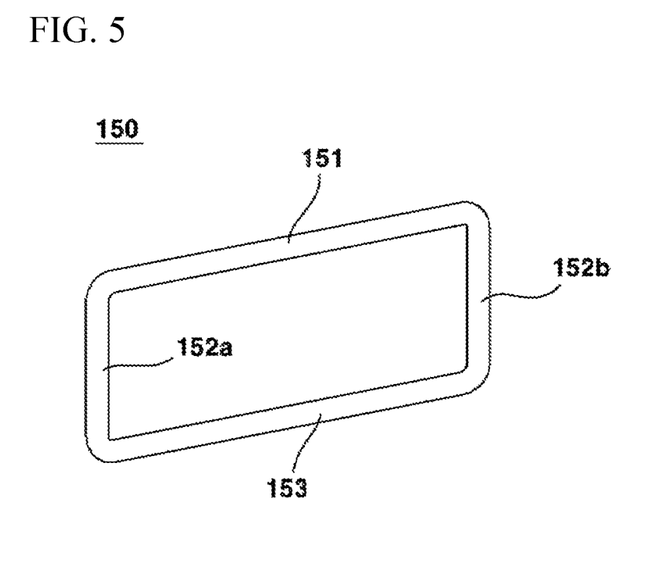
FIG. 5 is a perspective view of a heat transfer path according to an embodiment of the present invention.
Figure 6:
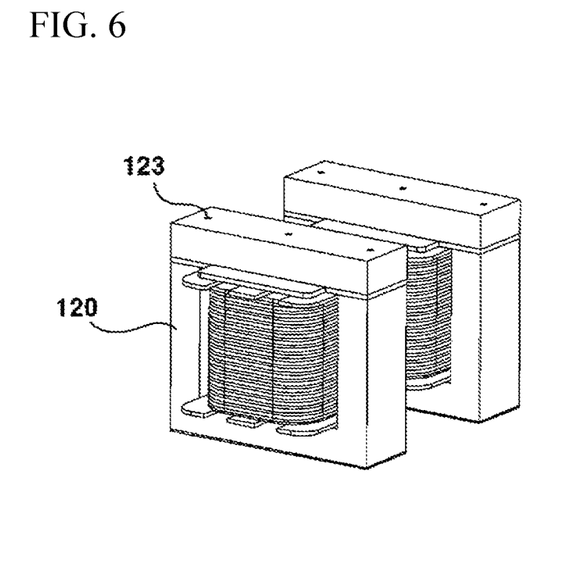
FIGS. 6 to 10 are diagrams illustrating an assembly process of a heat dissipation module according to an embodiment of the present invention.
Figure 7:
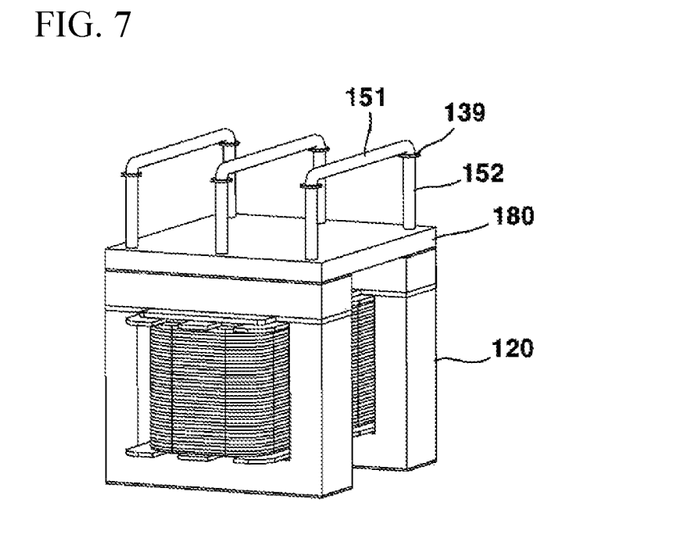
Figure 8:
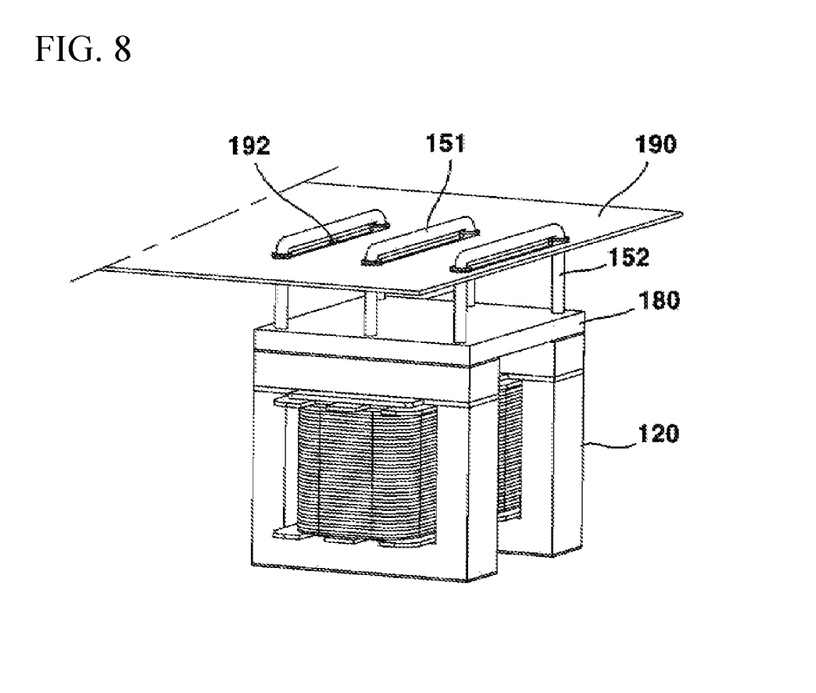
Figure 9:
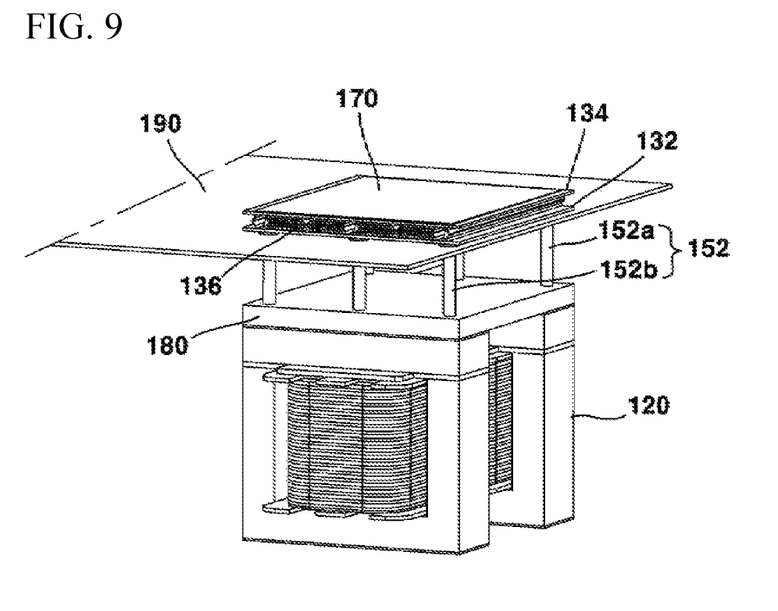
Figure 10:
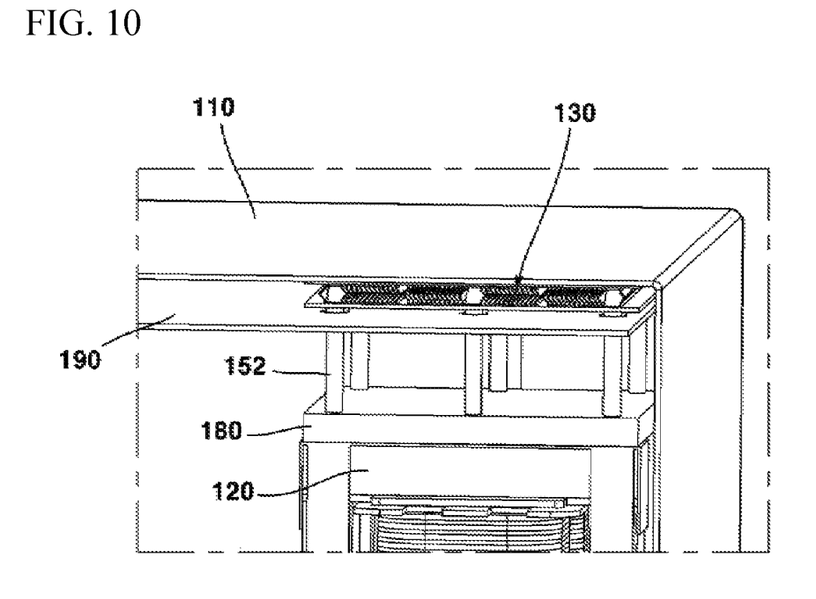

FIG. 1 is a perspective view of a power conversion device according to an embodiment of the present invention; FIG. 2 is an exploded perspective view of a power conversion device according to an embodiment of the present invention; FIG. 3 is a perspective view of a heat dissipation module according to an embodiment of the present invention; FIG. 4 is a cross-sectional view illustrating a coupling structure of a heat dissipation module according to an embodiment of the present invention; FIG. 5 is a perspective view of a heat transfer path according to an embodiment of the present invention; and FIGS. 6 to 10 are diagrams illustrating an assembly process of a heat dissipation module according to an embodiment of the present invention.

Referring to FIGS. 1 to 10, the external shape of the power conversion device 100 according to an embodiment of the present invention may be formed by a housing 110. The housing 110 may have a rectangular parallelepiped shape. At least one electronic component for driving the power conversion device 100 may be disposed inside the housing 110. A heat dissipation module may be disposed inside the housing 110. The housing 110 may be formed by coupling a first housing 110a and a second housing 110b. The first housing 110a and the second housing 110b may be coupled in an up-and-down direction. Unlike this, the housing 110 may be formed as a single body.

A plurality of electronic components may be disposed inside the housing 110. The plurality of electronic components may include a heat dissipation module. The heat dissipation module may include a heating element 120, a heat dissipation member 130, and a heat transfer path 150.

The heating element 120 is disposed inside the housing 110 and may generate heat by driving. The heating element 120 may include an inductor for obtaining inductance, a transformer for voltage regulation, and an FET element. In this specification, the type of the heating element 120 is not limited. The heating element 120 may be disposed on a bottom surface of a space inside the housing 110.

The heating element 120 may include a core 121 and a case 122 surrounding the core 121.

When the heat dissipation member 130, which will be described later, is disposed at one side of the heating element 120, a heat sink may be disposed at the other side of the heating element 120.

A printed circuit board 190 may be disposed inside the housing 110. The printed circuit board 190 is formed in a plate shape, and a plurality of elements may be mounted on an upper surface or a lower surface. The printed circuit board 190 may be disposed at an upper side of the heating element 120. The printed circuit board 190 may be spaced apart from the heating element 120 in an up-and-down direction. At least a portion of the printed circuit board 190 may be disposed to be overlapped with the heating element 120 in an up-and-down direction.

The heat dissipation member 130 may be disposed on one side of the heating element 120. The heat dissipation member 130 may be disposed at an upper side of the heating element 120. The heat dissipation member 130 may be disposed to be spaced apart from the heating element 120 in an up-and-down direction.

In detail, the heat dissipation member 130 may include a first plate 132 and a second plate 134. The first plate 132 and the second plate 134 are each formed in a plate shape and may be spaced apart by a predetermined distance in up-and-down direction. A plurality of fins 136 may be formed between the first plate 132 and the second plate 134. Upper and lower ends of the fin 136 may be coupled to connect an upper surface of the first plate 132 and a lower surface of the second plate 134, respectively. The fin 136 may be formed of a metal material. The fin 136 may be made of an elastic member. The fin 136 may provide elastic force to the first plate 132 or the second plate 134. A distance between the first plate 132 and the second plate 134 may be increased or decreased by the elastic force.

With respect to the up-and-down direction, the central region of the fin 136 may have a shape being protruded outward. As illustrated in FIG. 4, the central region of the fin 136 may have a shape being protruded toward one side or the other side compared to other regions.

A plurality of fins 136 may be disposed in a first region and a second region. The first region and the second region may be partitioned with respect to an imaginary line LO dividing a distance between a plurality of unit heat transfer paths, which will be described later, into ½. The shape of the fin 136 being disposed in the first region and the shape of the fin 136 being disposed in the second region may be symmetric with respect to the imaginary line LO. For example, assuming that the fin 136 has a first side surface and a second side surface facing the first side surface, the fin 136 being disposed in the first region is formed so that the central region of the first side surface is protruded outward, and the fin 136 being disposed in the second region may be formed so that the central region of the second side surface is protruded outward. Here, the first side surface of the fin 136 being disposed in the first region and the second side surface of the fin 136 being disposed in the second region may face each other. Of course, the first side surface and the second side surface may be opposite surfaces of mutually facing surfaces.

The first region and the second region may be partitioned with respect to a single unit heat transfer path. In this case, the fin 136 inside the first region being disposed at one side of the unit heat transfer path is formed so that the central region of the first side surface is protruded outward, and the fin 136 inside the second region is formed so that the central region of the second side surface is protruded outward, and thus, the shapes of the fin 136 inside the first region and the fin 136 inside the second region can be symmetrical to each other.

Meanwhile, a first hole 135 penetrating the lower surface from the upper surface may be formed in the first plate 132. The first hole 135 may be a long hole having a predetermined length. The first hole 135 may have a long axis greater than or equal to the length of the long axis of the first path 151 inside the heat transfer path 150, which will be described later. The first hole 135 may be provided in plural to correspond to the number of plural unit heat transfer paths. The plurality of first holes 135 may be spaced apart from one another.

A heat transfer pad 138 may be disposed on a lower surface of the second plate 134. The heat transfer pad 138 may be formed of a material with excellent heat transfer. The heat transfer pad 138 may be in contact with a first path 151 of a heat transfer path 150, which will be described later.

The heat dissipation module may include a third plate 180. The third plate 180 may be disposed on one side of the heating element 120. The third plate 180 may be disposed on an upper surface of the heating element 120. A lower surface of the third plate 180 may be in contact with an upper surface of the heating element 120. The third plate 180 and the heating element 120 may be screw-coupled together. The third plate 180 may be formed in a plate shape. The cross-sectional shape of the third plate 180 may be formed to correspond to a cross-sectional shape of the first plate 132 or the second plate 134.

The heat dissipation module may include a heat transfer path 150. The heat transfer path 150 may transfer heat generated from the heating element 120 to the heat dissipation member 130. A path through which a refrigerant flows may be formed inside the heat transfer path 150. Or, the path may be an empty space, and air heated by the heating element 120 in the empty space may be transferred to the heat dissipation member 130 by a convection phenomenon. The heat transfer path 150 may include a refrigerant pipe.

The heat transfer path 150 may include a plurality of unit heat transfer paths. The plurality of unit heat transfer paths may be spaced apart from one another along a first direction perpendicular to an up-and-down direction. The plurality of unit heat transfer paths may have lower ends being coupled to the third plate 180 and upper ends being coupled to the heat dissipation member 130.

In detail, each of the unit heat transfer paths may comprise: a first path 151 being disposed between the first plate 132 and the second plate 134; a third path 153 being disposed inside the third plate 180; and a second path 152 connecting the first path 151 and the third path 153 and being disposed between the first plate 132 and the third plate 180.

As illustrated in FIG. 5, the heat transfer path 150 may have a rectangular cross section. The second path 152 may include a second-first path 152a connecting one end of the first path 151 and one end of the third path 153, and a second-second path 152b connecting the other end of the first path 151 and the other end of the third path 153. The second path 152 may be disposed perpendicular to the first path 151 or the third path 153. A corner region where the first path 151 and the second path 152 meet and a corner region where the second path 152 and the third path 153 meet may be formed to be rounded. The second path 152 may be called a connecting path in that it connects the first path 151 and the third path 153.

Meanwhile, the shape of the heat transfer path 150 illustrated in FIG. 5 is exemplary, and the heat transfer path 150 may have various shapes. For example, the shape of the heat transfer path 150 may be one among: "H" shape in which only one second path 152 is disposed in the central portion of the first path 151 and the third path 153; "T" shape which transfers the heat generated in the third plate 180 to the second path 152 without the third path 153; and "⊏" shape in which only one of the second-first path 152a or the second-second path 152b of the second path 152 is formed.

Second paths 152 of the plurality of unit heat transfer paths may be spaced apart from one another. The second paths 152 of the plurality of unit heat transfer paths may be disposed parallel to one another.

The first path 151 may be disposed between the first plate 132 and the second plate 134. The first path 151 may be disposed parallel to the first plate 132 or the second plate 134. As described above, a first hole 135 may be formed in the first plate 132 through which the heat transfer path 150 penetrates. The first path 151 may be in contact with the heat transfer pad 138. A lower surface of the heat transfer pad 138 may be disposed lower than a lower surface of the second plate 134 to have a step difference. Heat from the heat transfer path 150 may be transferred to the heat dissipation member 130 by the contact between the first path 151 and the heat transfer pad 138. That is, the heat transfer pad 138 and the first path 151 come into surface contact with each other, and as the contact area increases, more heat can be transferred to the heat dissipation member 130.

Meanwhile, the third paths 153 of each unit heat transfer path may be interconnected inside the third plate 180. In this case, a plurality of third paths 153 may have a polygonal closed loop shape inside the third plate 180. Accordingly, flow channels inside the plurality of unit heat transfer paths may be connected to one another.

A second hole 192 through which the heat transfer path 150 penetrates may be formed in the printed circuit board 190. An inner circumferential surface of the second hole 192 may be spaced apart from the heat transfer path 150. A region of the heat transfer path 150 being disposed inside the second hole 192 may be the second path 152.

The second hole 192 may be disposed to be overlapped with the first hole 135 in an up-and-down direction. The cross-sectional area of the second hole 192 may be larger than that of the first hole 135. As illustrated in FIG. 2, the second hole 192 may also be a long hole having a predetermined length. The lengths of the long axes of the first hole 135 and the second hole 192 may be greater than or equal to the length of the long axes of the first path 151.

The heat transfer path 150 may include a step portion 139. The step portion 139 may be formed on an outer circumferential surface of the second-first path 152a and an outer circumferential surface of the second-second path 152b. The step portion 139 may be protruded outward from an outer circumferential surface of the heat transfer path 150 compared to other regions. The step portion 139 may have a ring-shaped cross section. The step portion 139 may support a lower surface of the first plate 132. The cross-sectional area of the step portion 139 may be smaller than the cross-sectional area of the second hole 192 and larger than the cross-sectional area of the first hole 135. Through this, the heat transfer path 150 may penetrate through the printed circuit board 190 and support the first plate 132 of the heat dissipation member 130.

Hereinafter, a process of assembling the heat dissipation module will be described.

Referring to FIGS. 6 to 10, first, the heating element 120 is disposed in a space inside the housing 110, and a third plate 180 coupled with the heat transfer path 150 is assembled on an upper surface of the heating element 120. The third plate 180 and the heating element 120 may be screw-coupled together. To this end, one or more screw holes may be formed on an upper surface of the heating element 120. Or, the heat generating element 120 and the third plate 180 may be coupled together in the form of attaching the heating element 120 and the third plate 180 using a heat transfer pad having an adhesive property.

Next, the printed circuit board 190 and the heat dissipation member 130 may be coupled to an upper portion of the heating element 120. The heat transfer path 150 penetrates through the second hole 192 and the first hole 135 so that the first path 151 may be disposed between the first plate 132 and the second plate 134. At this time, the region of the heat transfer path 150 passing through the first hole 135 may be guided by the step portion 139.

Meanwhile, an upper surface of the heat dissipation member 130 and an upper surface of the second plate 134 may be in contact with an inner surface of the housing 110. In this case, a heat transfer pad 170 may be disposed between the upper surface of the second plate 134 and the inner surface of the housing 110. Accordingly, heat generated from the heating element 120 may be transferred to the housing 110 along the heat transfer path 150, the heat dissipation member 130, and the heat transfer pad 170.

According to the structure as described above, by forming a heat dissipation path through the heat dissipation member 130 and the heat transfer path 150, there is an advantage in that the heat of the heating element 120 can be efficiently dissipated. In particular, since it is possible to form a heat dissipation structure while sufficiently securing an arrangement region of other components including the printed circuit board 190, there is an advantage in that a wider space inside the housing 110 can be secured.

In addition, by elastically supporting the heating element 120 on an inner surface of the housing 110 through the elastic force of the plurality of fins 136 of the heat dissipating member 130, the heating element 120 can be firmly fixed to the installation region, the heat transfer pad 138 disposed on a lower surface of the second plate 134 is in surface contact with the first path 151 of the heat transfer path 150 in the process of fixing so that there is an advantage in that the heat dissipation efficiency is improved due to the increased contact force.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A heat dissipation module comprising:
a heating element;
a heat dissipation member being disposed on one side of the heating element, the heat dissipation member including:
a first plate;
a second plate; and
a plurality of fins disposed between the first plate and the second plate, the fins being elastic members;
a third plate being disposed on the one side of the heating element; and
a heat transfer path for transferring heat generated from the heating element to the heat dissipation member, the heat transfer path comprising:
a first path being disposed between the first plate and the second plate;
a third path being disposed inside the third plate; and
a plurality of second paths connecting the first path and the third path,
wherein the respective second paths are spaced apart from one another.

2. The heat dissipation module according to claim 1, wherein the heat dissipation member further includes a heat transfer pad disposed on a lower surface of the second plate, and
wherein the heat transfer pad is in contact with the first path.

3. A heat dissipation module comprising:
a heating element;
a heat dissipation member being disposed on one side of the heating element, the heat dissipation member including:
a first plate; and
a second plate; and
a heat transfer path that transfers heat generated from the heating element to the heat dissipating member, the heat transfer path including:
a first path being disposed between the first plate and the second plate;
a second path being connected to the first path and disposed between the heating element and the heat dissipation member; and
a stepped portion formed on an outer surface of the second path,
wherein the first plate includes a first hole having a long axis having a length greater than or equal to a length of a long axis of the first path, the first plate being disposed on the stepped portion.

4. The heat dissipation module according to claim 3, further comprising a substrate disposed between the heat dissipation member and the heating element,
wherein the substrate includes a second hole through which the heat transfer path penetrates.

5. The heat dissipation module according to claim 4, wherein an inner circumferential surface of the second hole is spaced apart from the heat transfer path.

6. The heat dissipation module according to claim 4, wherein a cross-sectional area of the first hole is larger than a cross-sectional area of the second hole.

7. The heat dissipation module according to claim 4, wherein the first hole is overlapped with the second hole in an up-and-down direction.

8. The heat dissipation module according to claim 4, wherein the length of the long axis of the first hole and a length of a long axis of the second hole are each greater than or equal to the length of the long axis of the first path.

9. The heat dissipation module according to claim 3, wherein the heat transfer path further includes a plurality of second heat transfer paths, and
wherein each of the plurality of second heat transfer paths is spaced apart from each other.

10. The heat dissipation module according to claim 3, further comprising a substrate is-disposed between the heat dissipation member and the heating element,
wherein the substrate includes a second hole through which the heat transfer path passes, and
wherein an outer diameter of the stepped portion is smaller than an outer diameter of the second hole and larger than an outer diameter of the first hole.

11. A heat dissipation module comprising:
a heating element;
a heat dissipation member being disposed on one side of the heat heating element, the heat dissipation member including:
a first plate;
a second plate; and
a plurality of fins disposed between the first plate and the second plate, the fins being elastic members; and
a heat transfer path for transferring heat generated from the heating element to the heat dissipating member,
wherein the heat transfer path includes a plurality of unit heat transfer paths, each unit heat transfer path including:
one side to which heat of the heating element is transferred;
an other side being disposed between the first plate and the second plate; and
a connecting path connecting the one side and the other side, wherein the connecting paths of the plurality of unit heat transfer paths are spaced apart from each other, and
wherein the first plate includes a plurality of first holes through which the other side of the plurality of unit connecting paths passes.

12. The heat dissipation module according to claim 11, further comprising a third plate is disposed on the one side of the heating element, and
    wherein the heat transfer path includes a first path disposed in the heat dissipation member, a third path disposed in the third plate, and a 2-1 path and a 2-2 path disposed between the first path and the third.

13. The heat dissipation module according to claim 12, wherein one ends of the 2-1 path and the 2-2 path are connected to the first path, and
    wherein the other ends of the 2-1 path and the 2-2 path are connected to the third path.

14. The heat dissipation module according to claim 3, wherein each unit heat transfer path is configured as a polygonal closed loop.

15. The heat dissipation module according to claim 11, further comprising a heat sink is-disposed on the other side of the heating element.

16. A heat dissipation module comprising:
    a heating element;
    a heat dissipation member being disposed on one side of the heating element;
    a heat transfer path being disposed between the heat dissipation member and the heating element; and
    a substrate being disposed between the heat dissipating member and the heating element,
    wherein the heat transfer path has one side being disposed adjacent to the heating element and the other side being disposed inside the heat dissipation member through the substrate, and
    wherein the substrate is spaced apart from the heating element and the heat dissipation member.

17. The heat dissipation module according to claim 16, wherein a third plate is disposed on one side of the heating element, and
    wherein the heat transfer path includes a first path disposed in the heat dissipation member, a third path disposed in the third plate, and a 2-1 path and a 2-2 path disposed between the first path and the third path.

18. A power conversion device comprising:
    a housing;
    a heating element placed in the housing;
    a heat dissipation member, the heat dissipation member including:
        a first plate;
        a second plate disposed on one side of the heating element and spaced apart from the first plate in a vertical direction; and
        a plurality of fins disposed between the first plate and the second plate, the fins being elastic members;
    a third plate disposed on the one side of the heating element;
    a heat transfer path connecting the heating element and the heat dissipation member, the heat transfer path including:
        a first path disposed between the first plate and the second plate;
        a third path disposed in the third plate; and
        a second path connecting the first path and the third path, and
    a heat transfer pad is-disposed between an outer surface of the second plate and an inner surface of the housing.

* * * * *